United States Patent [19]

Skinner

[11] Patent Number: 5,005,084
[45] Date of Patent: Apr. 2, 1991

[54] REMOTE CONTROL TELEVISION SYSTEM USING SUPPLEMENTARY UNIT FOR SIMPLIFIED PERSONALIZED CONTROL

[75] Inventor: Kenneth R. Skinner, Jefferson City, Tenn.

[73] Assignee: North American Philips Corporation, New York, N.Y.

[21] Appl. No.: 452,983

[22] Filed: Dec. 19, 1989

[51] Int. Cl.⁵ .......................... H04N 5/44; H03J 9/06
[52] U.S. Cl. ................................ 358/194.1; 455/603
[58] Field of Search ................... 358/194.1; 455/603, 455/352, 353, 355

[56] References Cited

U.S. PATENT DOCUMENTS

| | | | |
|---|---|---|---|
| 4,539,711 | 9/1985 | Harger | 358/191.1 |
| 4,626,848 | 12/1986 | Ehlers | 455/603 |
| 4,905,279 | 2/1990 | Nishio | 358/194.1 |

Primary Examiner—Howard W. Britton
Assistant Examiner—Glen Burgess
Attorney, Agent, or Firm—Edward W. Goodman

[57] ABSTRACT

A complex television system is provided for accommodating at the same time both highly technically oriented and less technically oriented users of the system. The system includes a state of the art complex television, a complex remote control transmitter device for use by the technically oriented user in both programming and, if desired, controlling the television, and a simple auxiliary remote control transmitter device for the less technically oriented user. The simple auxiliary remote control transmitter device has a minimum of keys, such as power-on, channel-up, channel-down, volume-up, and volume-down, as well as a switch which identifies the user. Different power-on and channel-up and down codes for each switch position is provided by the simple auxiliary remote control transmitter device, and each such code is different than the corresponding codes of the complex remote control transmitter device. In this manner, a microprocessor in the television will recognize which user is in control. By using the complex remote control transmitter device, values for personal preference parameter and/or channel rings associated with each user may be entered and stored in a programmable memory of the television. Then, when the television recognizes the power-on code for a particular user, the personal preference parameter and/or channel rings are immediately accessed. In this manner, less technically oriented users may be the beneficiaries of complex personal preference rings programmed by them by a highly technically oriented user, and will only have to deal with a simple auxiliary remote control transmitter device to control the television.

20 Claims, 7 Drawing Sheets

CHANNEL UP FROM COMPLEX XMTR 100 (CODE #32)

CHANNEL DN FROM COMPLEX XMTR 100 (CODE #33)

CHANNEL UP AUX XMTR (CODE #28) SWITCH 280 POS. 1

CHANNEL DN AUX XMTR (CODE #29) SWITCH 280 POS. 1

CHANNEL UP
AUX XMTR
(CODE #30)
SWITCH 280
POS. 2

CHANNEL DN
AUX XMTR
(CODE #31)
SWITCH 280
POS. 2

CHANNEL UP
AUX XMTR
(CODE #21)
SWITCH 280
POS. 3

CHANNEL DN
AUX XMTR
(CODE #39)
SWITCH 280
POS. 3

REMOTE CONTROL TELEVISION SYSTEM USING SUPPLEMENTARY UNIT FOR SIMPLIFIED PERSONALIZED CONTROL

BACKGROUND

1. Field of Invention

This invention relates generally to remote control television systems, and more particularly to complex television systems capable of automatic personalized control.

2. State of the Art

The complexity of television systems has considerably increased as expanded use has been made of microprocessors and integrated circuits within the television. In complex television systems, remote control of numerous aspects of the audio and video are provided, as well as remote control of related devices such as cable and satellite devices, stereophonic equipment, etc. Advanced television systems even permit the programming of personal preferences of a plurality of different users into the system. Thus, at the touch of a few buttons, a personal preference parameter "ring" which automatically controls the main channel tint, brightness, saturation, contrast, sharpness, balance, and audio bass and treble, the PIP contrast, brightness, saturation, tint, video source, and mode, channel and time display options, etc. can be activated. A personal preference channel ring is also accommodated in the state of the art complex television system (see e.g. Templin et al. U.S. Pat No. 4,375,651, Deiss U.S. Pat. No. 4,495,654, and Filliman U.S. Pat. No. 4,603,438) with a preferred channel automatically accessed, and the pressing of a channel forward or scan button causing the tuner to tune to the next channel specified in the personal preference channel ring.

For operation, previous remote control transmitters which accompany complex television systems, have a burton labeled "Personal Preference". When pressed, a television on-screen display prompts the user to select a level number. After pressing the appropriate digit button, the TV control system switches all of the personal preference parameters to those associated with the digit (i.e. level or person). Of course, prior to operation, programming of the remote television receiver is required.

While the complexity of the television systems of the art permit several users to at least partially customize a television to their requirements or desires, and after programming to obtain the customized and desired parameters extremely easily, there exists a "down side" to the technology. In particular, extreme frustration and intimidation is perceived by less technically oriented individuals who are confronted with a seemingly very complicated remote control transmitter. In fact, while complex television systems appeal to those who are comfortable with new technology, where such a system is to be shared by the less technically oriented individual, the complexity of the remote control device itself can act as a barrier to the sale of the complex system.

SUMMARY OF THE INVENTION

It is therefore an object of the invention to provide a complex television system whose primary functions are operable via a simple remote control device and whose primary and complex functions are operable via a complicated remote control device.

It is another object of the invention to provide a complex television system having a simple remote control device with a personal preference parameter ring and channel preference ring associated therewith, values for the personal preference parameter rings and channel number indicators for the personal preference and channel rings having been programmed into the system via a complicated remote control device.

It is a further object of the invention to provide a complex television system having a simple remote control device which accommodates a plurality of personal preference parameter rings and channel preference rings.

In accord with the objects of the invention, a complex television system comprises a first remote control transmitter device, an auxiliary remote control transmitter device, and a television.

The television has: an infrared receiver means for receiving infrared signals from said first and auxiliary remote control transmitters; parameter control means for effecting control over an audio or video parameter of the television; a microprocessor including decode means coupled to the infrared receiver means for distinguishing between at least one signal of the first and auxiliary remote control transmitters and for determining the meaning of the received infrared signals, and control means coupled to the parameter control means for controlling the parameter control means in response to the received infrared signals; and a programmable memory means for storing values !or a plurality of personal preference parameter rings including a value for the audio or video parameters, the memory means being coupled to the parameter control means and the microprocessor means. Preferably, the programmable memory means also stores a plurality of channel number indications for a plurality of channel preference rings.

The first remote control transmitter device includes a plurality of keyboard keys, an infrared transmitter, and optionally, a memory means and a microprocessor. Code data capable of causing the infrared transmitter to transmit information to the television which causes the television to store values for its programmable memory personal preference parameter rings, are stored in the memory of the first remote control transmitter. Additional code data capable of causing the infrared transmitter to transmit information which controls all functions of the television are also stored in the memory of the first remote control device.

The auxiliary remote control transmitter device is preferably configured similarly to the first transmitter device, except that it includes substantially fewer keyboard keys than the first remote control transmitter, and correspondingly has reduced code stored in memory. The auxiliary remote control transmitter device is incapable of controlling any except the most basic functions of the television, and is similarly incapable of causing the television to store information in its programmable memory. Preferably, the auxiliary remote control transmitter device includes a switch to accommodate multiple users thereof, wherein each switch position is associated with a different personal preference parameter ring and/or personal preference channel ring.

Additional objects and advantages of the invention will become evident upon reference to the detailed description in conjunction with the provided drawings.

DETAILED DESCRIPTION OF THE PREFERRED EMBODIMENT

Figure 1:
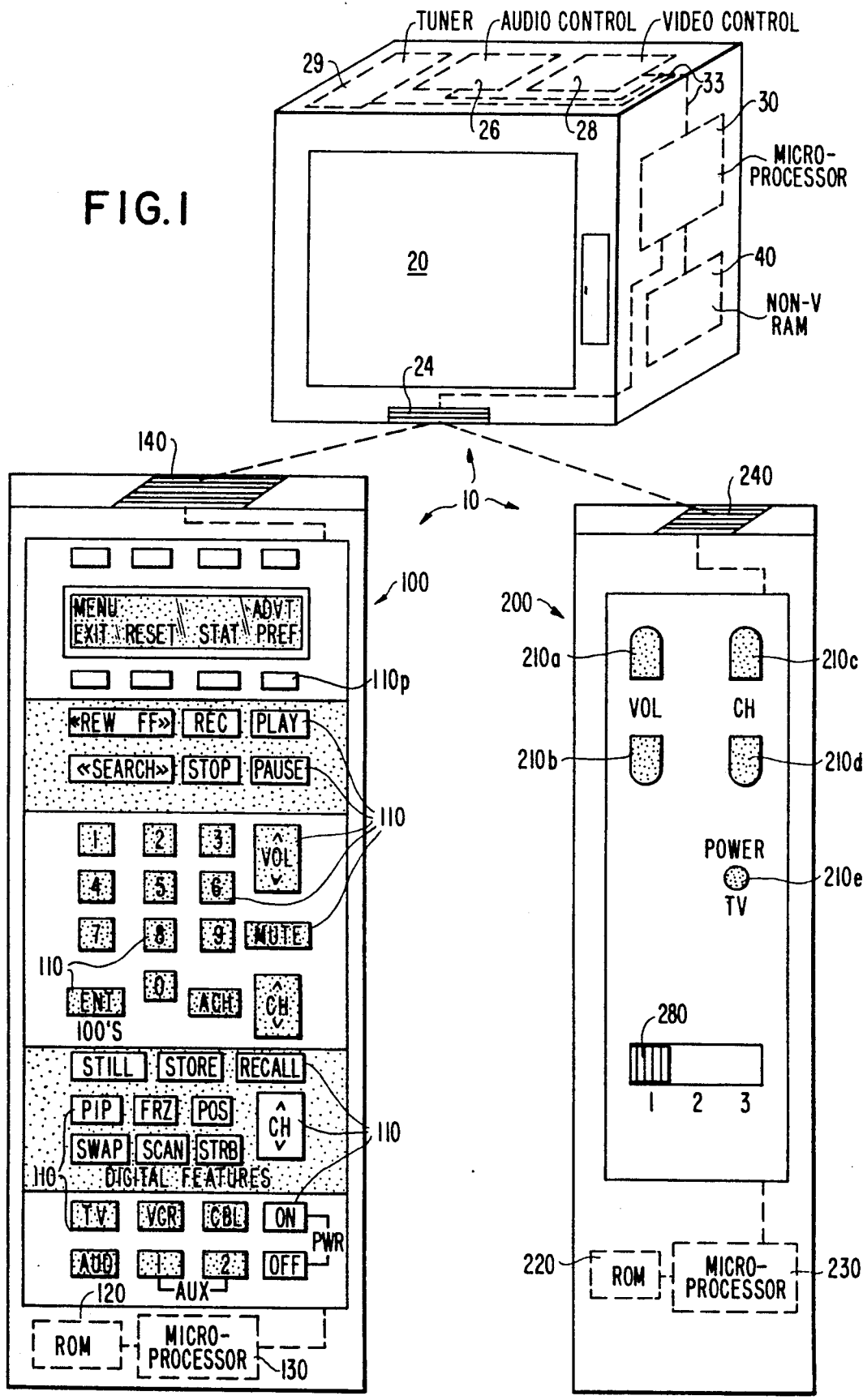
FIG. 1 is a schematic diagram of the system of the invention including a television, a complex remote control device, and an auxiliary remote control device.

Turning to FIG. 1, the system 10 of the invention is seen with a television 20, a complex remote control device 100 and an auxiliary remote control device 200. The television 20 is preferably an expanded version of Philips Consumer Electronics Company Philips television model number 27K291SB. As is standard in televisions of that complexity, the television includes an infrared receiver 24, banks of controllers 26, 28, end 29, a microprocessor 30, a serial bus 33 connecting the controllers and microprocessor, and a nonvolatile programmable memory 40. The infrared receiver 24 receives infrared signals from remote control transmitters, and forwards the information to microprocessor 30 which in conjunction with memory 40 (or other ROM memory not shown) interprets the signals as command code. Then, the microprocessor 30, in conjunction with its associated memory and nonvolatile programmable memory 40, issues appropriate control commands to controllers such as controllers 26 and 28 which effect control over the audio and video parameters of the television, and controller 29 which tunes the television to the desired channel. Additional details of such a television system may be obtained by referring to the User's Manual for Philips model 27K291SB and specification 371697 (NC-6 27" and 31" Chassis Alignment and Test specification) which are hereby incorporated by reference herein.

The first remote control transmitter device 100 (also called the "complex remote") essentially comprises a large set of keyboard keys and switches 110, a memory means 120, a microprocessor 130, and an infrared transmitter 140 as is well known in the art. By pressing the keys 110, circuits are closed which indicate to the microprocessor 130 which of numerous commands is desired to be transmitted. Then, using the memory means 120, the microprocessor 130 generates information which causes the transmitter 140 to transmit a desired code. The transmitted code is received by the infrared receiver 24 of the television, and is interpreted by the microprocessor 30 of the television.

The first remote control transmitter device 100 is intended for use by a technically oriented user who is capable of using the complex remote device to cause the television to store in its programmable memory a plurality of personal preference parameter rings. The values for the audio and video parameters are entered into the programmable memory via instructions transmitted by first remote control transmitter device 100 and received by television 20 during a programming routine which is initiated by the user who is comfortable with such technology. Routines and signals for obtaining and storing such values are known to those skilled in the art. Similarly, the first remote control transmitter device 100 can also cause the television to store in its programmable memory 40 values for a plurality of personal preference channel rings which are provided via instructions transmitted by the first remote control transmitter device 100 during a programming routine conducted by microprocessor 30 of television 20. Where personal preference channel rings are entered, each personal preference parameter ring is preferably associated with a personal preference channel ring. Further, both personal preference rings are associated with a user identification as will be described in more detail below.

The auxiliary remote control transmitter device 200 is preferably configured similarly to the first remote control transmitter device 100, with keys 210, a memory means 220, a microprocessor 230, and an infrared transmitter 240, except that it includes substantially fewer keyboard keys than the first remote control transmitter device 100, and correspondingly has reduced code stored in the memory means. Another difference between remote control transmitter devices 100 and 200 is that the auxiliary remote control transmitter device 200 has a personal preference switch 280. Preferably, the auxiliary remote control transmitter device 200 has a minimum of keys so that it may be conveniently used by a non-technically oriented person. For example, as shown in FIG. 1, auxiliary remote control transmitter device 200 has only five keys and a switch: volume up key 210a; volume down key 210b; channel up key 210c; channel down key 210d; TV power key 210e; and switch 280 with three positions (1, 2, and 3) to accommodate up to three users. With a minimum of keys, the auxiliary remote control transmitter device 200 is incapable of directly controlling any except the most basic functions of the television 20, and is similarly incapable of causing the television 20 to store information in its programmable memory 40.

Figure 3A:
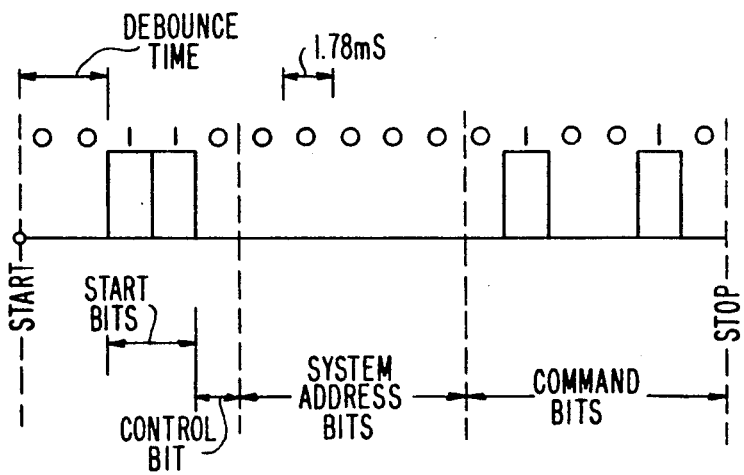
FIGS. 3a-3l are illustrative codes for the power on, channel up, and channel down functions provided by the complex remote control device and by the auxiliary remote control device in its personal preference switch locations one, two, and three.
Figure 3B:
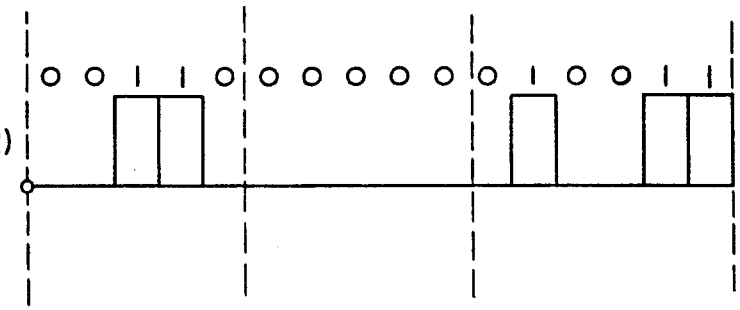
Figure 3C:
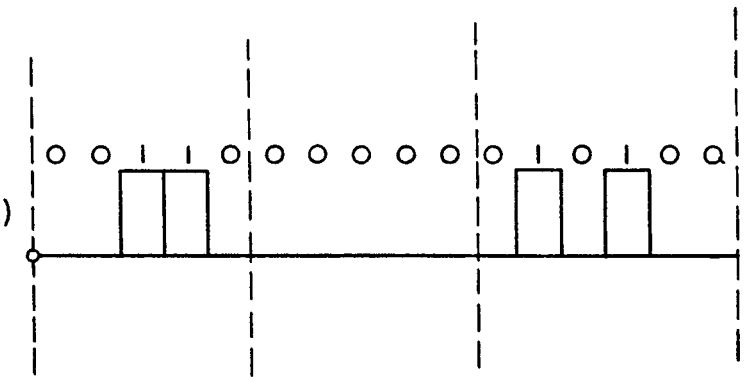
Figure 3D:
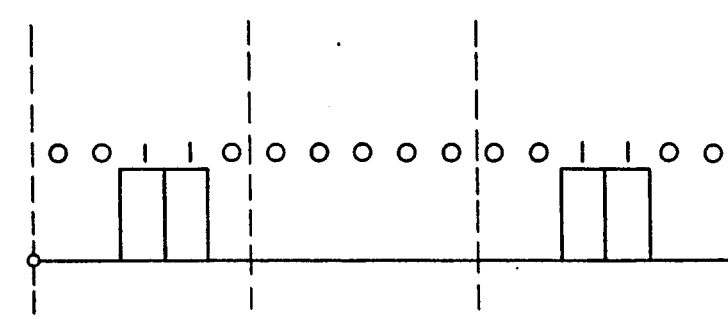
Figure 3E:
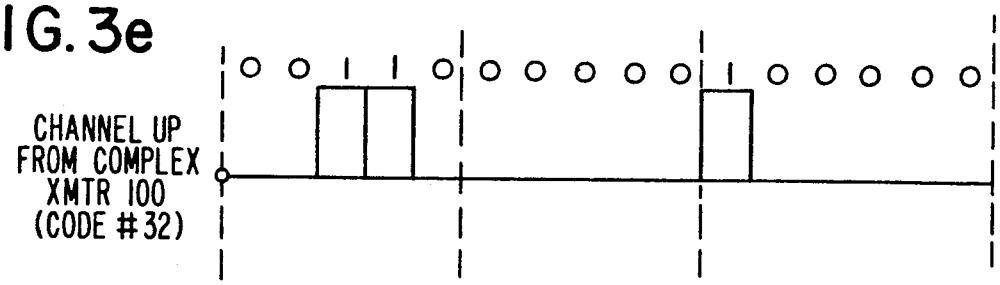
Figure 3F:
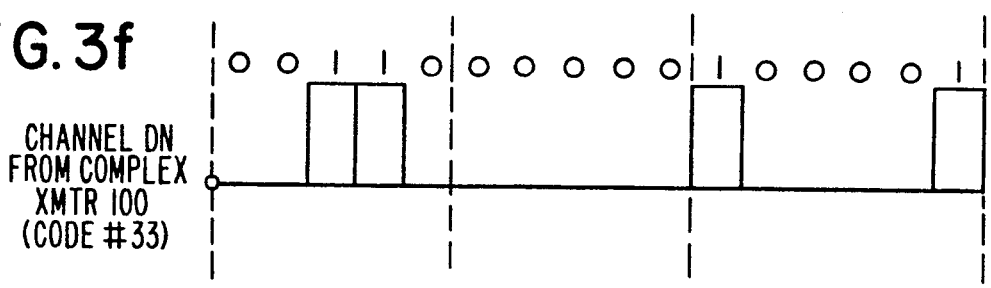
Figure 3G:
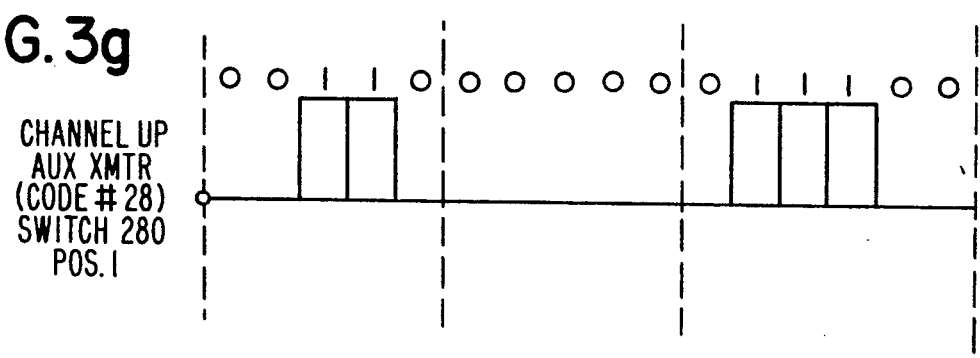
Figure 3H:
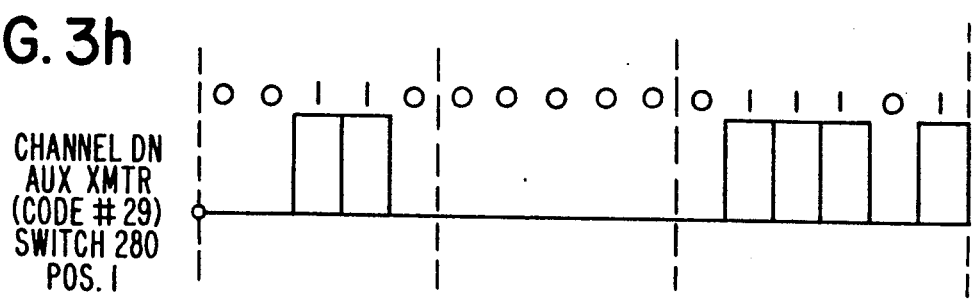
Figure 3I:
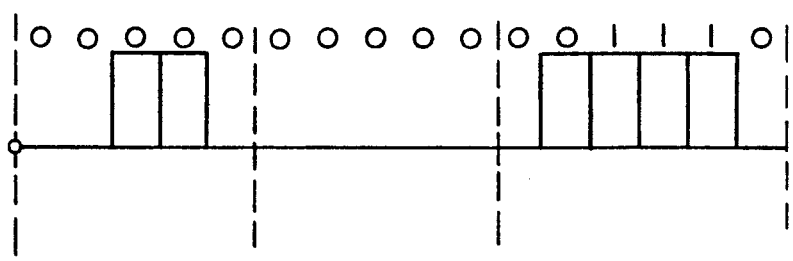
Figure 3J:
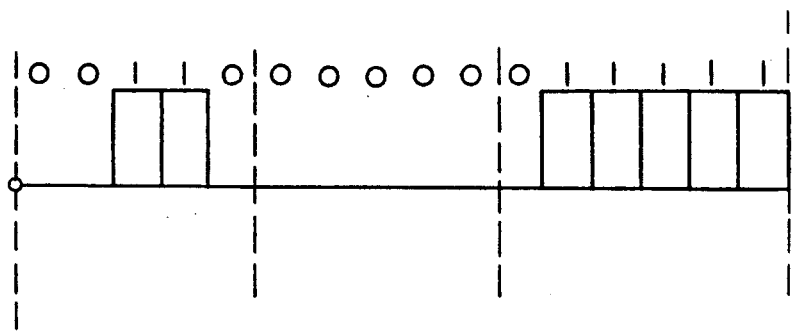
Figure 3K:
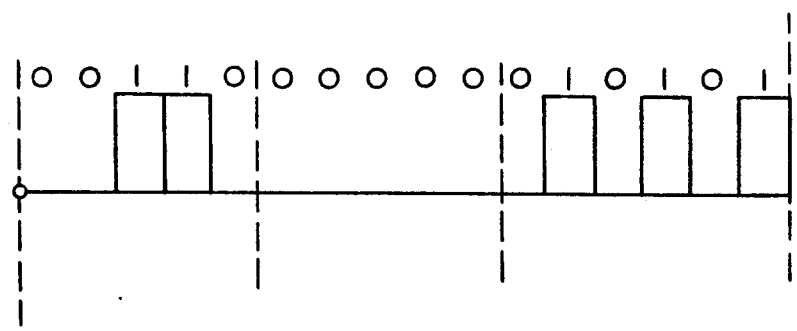
Figure 3L:
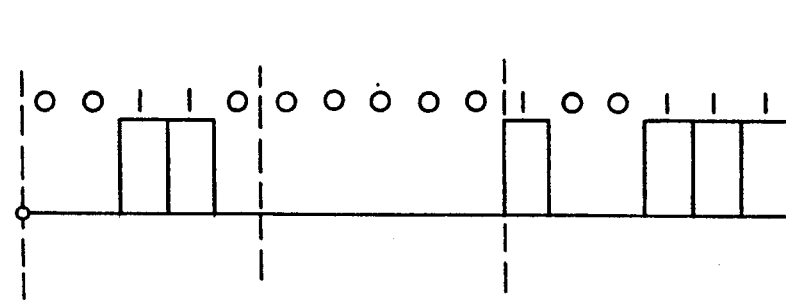

To distinguish between which of the users is using the auxiliary remote control transmitter device 200, the microprocessor 230, in conjunction with memory 220 if desired, senses in which position switch 280 is located. Then, in response to the pressing of the power TV key 210e, and depending on which position the switch 280 is located, the microprocessor 230 outputs a different appropriate command to the infrared transmitter 240. Thus, three different codes are generated for the TV power key 210e depending on the location of switch 280. Examples of the different codes for the TV power key 210e are seen in FIGS. 3a-3c. A fourth TV power-on code is seen in FIG. 3d and represents the code generated by the first remote control transmitter device 100. The microprocessor 30 and associated memory of the television 20 are arranged to recognize each of the four codes of FIGS. 3a-3d as television power-on commands, as well as to recognize from which remote control transmitter device the power-on command is being issued. The microprocessor 30 and associated memory also recognize which user is using the auxiliary remote control transmitter device 200 (i.e. which location switch 280 is positioned) based on the power-on code received.

Figure 2:
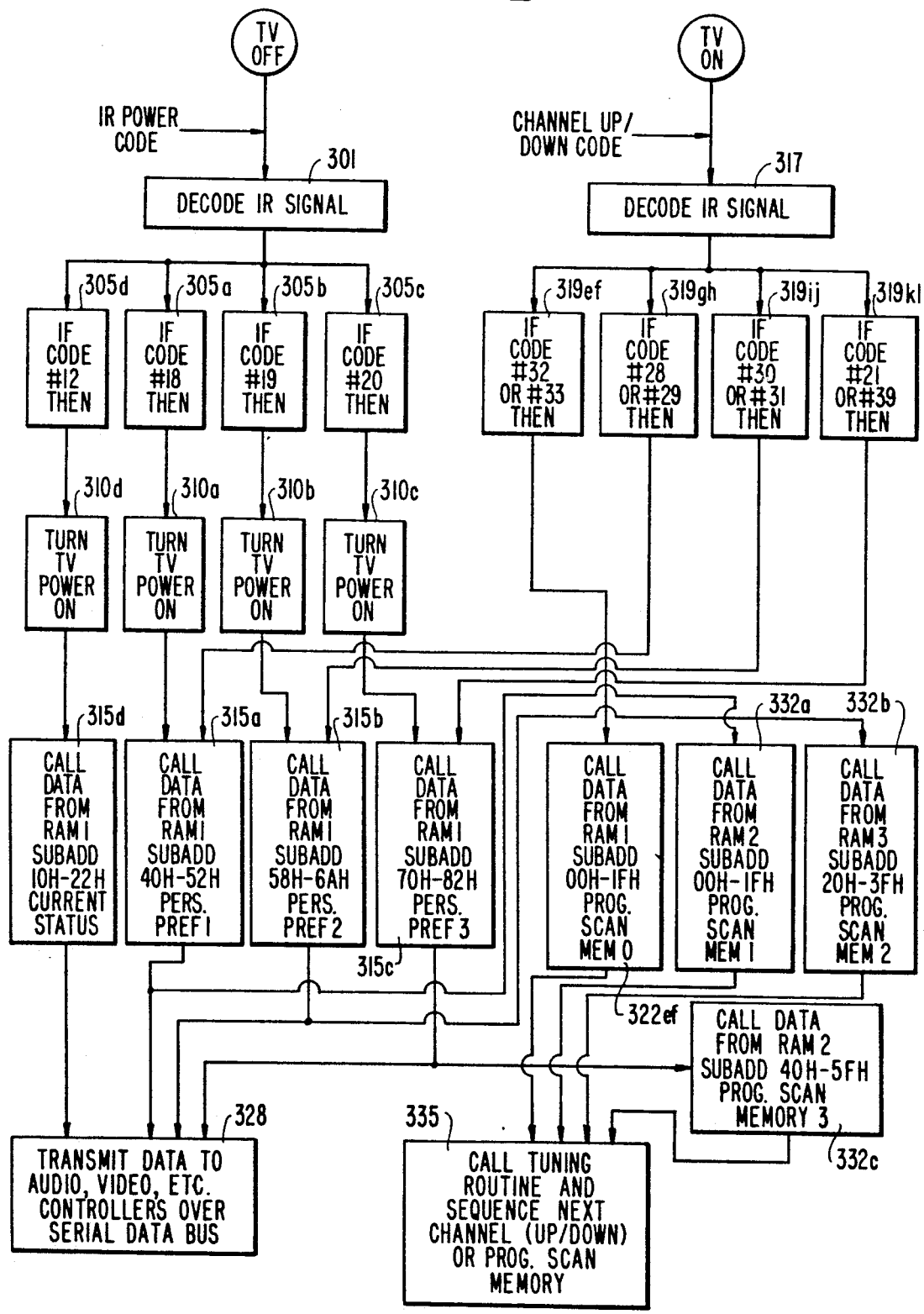
FIG. 2 is a high level flow diagram of the working of the microprocessor: of the television of the invention.

As indicated in FIG. 2, based on which of the four TV power on commands is received, the microprocessor 30 of television 20 is directed to a desired subroutine and accesses desired sets of information. For example, if, at 301, the code received by infrared receiver 24 is decoded, and the power-on code is determined at 305d to have been received from the first remote control transmitter device 100 (i.e. code #12), the microprocessor 30 would turn the television power on at 310d and would continue at step 315d in the mode (i.e. subroutine) it was in prior to entering the sleep mode. If the microprocessor 30 was in its general control routine, that routine would continue. On the other hand, if the power-on command was received from the auxiliary remote control transmitter device 200 (i.e. if code #18, #19 or #20 are received at step 305a, 305b, or 305c), the microprocessor 30 would turn the television power on at one of steps 310a, 310b, or 310c, and would automatically enter the personal preference parameter routine at 315a, 315b, or 315c. Thus, the microprocessor 30 would call data from appropriate addresses of the nonvolatile programmable memory 40, which data would be used by the microprocessor 30 to cause the controllers to regulate the audio and video at 328 according to desired values. The desired values would be those values previously entered and stored in nonvolatile programmable memory 40 for the particular user.

As further indicated by FIG. 2, the receipt of a power-on command by microprocessor 30 from the auxiliary remote control transmitter device 200 causes the microprocessor 30 to access at 332a, 332b, or 332c the personal preference channel ring of the particular user. The personal preference channel rings are also stored in programmable nonvolatile memory 40. Where a Philips model number 27K291SB television is used, an additional programmable nonvolatile memory (memory "2" with locations 00H-5FH) is provided for storing the channel ring information. The personal preference channel ring information obtained from the memory is then used by the microprocessor 30 at 335 to cause the tuner of the television to tune to a desired (start-up) channel.

Where the television is already on, and the infrared receiver 24 of the television receives at 317 a channel-up or-down signal (such as shown in FIGS. 3e-3l), if the code is determined at step 319ef to be code #32 or #33 (FIGS. 3e or 3f) from the first remote control transmitter device 100, data from the nonvolatile programmable memory 40 is provided at 322ef to the microprocessor 30. As a result, at 335, the microprocessor 30 causes the tuner 29 of the television to tune to the next channel (up or down) in the personal preference channel ring sequence. If the code is determined at one of steps 319gh, 319ij, or 319kl to be codes #28 or #29 (FIGS. 3g or 3h), #30 or #31 (FIGS. 3i or 3j), or #32 or #33 (FIGS. 3k or 3l) from the auxiliary remote control transmitter device 200, a call is made to the personal preference parameter data stored at 315a, 315b, or 315c, just in case a new user is using the auxiliary remote control transmitter device 200. If new personal preference data is obtained by the microprocessor 30, that information is used to regulate the audio and video at 328. Regardless, of whether a new user is using the auxiliary remote control transmitter device, data from associated locations in the second nonvolatile programmable memory is provided at 332a, 332b, or 332c to the microprocessor 30. As a result, the microprocessor causes the tuner 29 of the television at step 335 to tune to the next channel (up or down) in the personal preference channel ring sequence as found in the data accessed at 322a, 322b, or 322c.

Figure 4A:
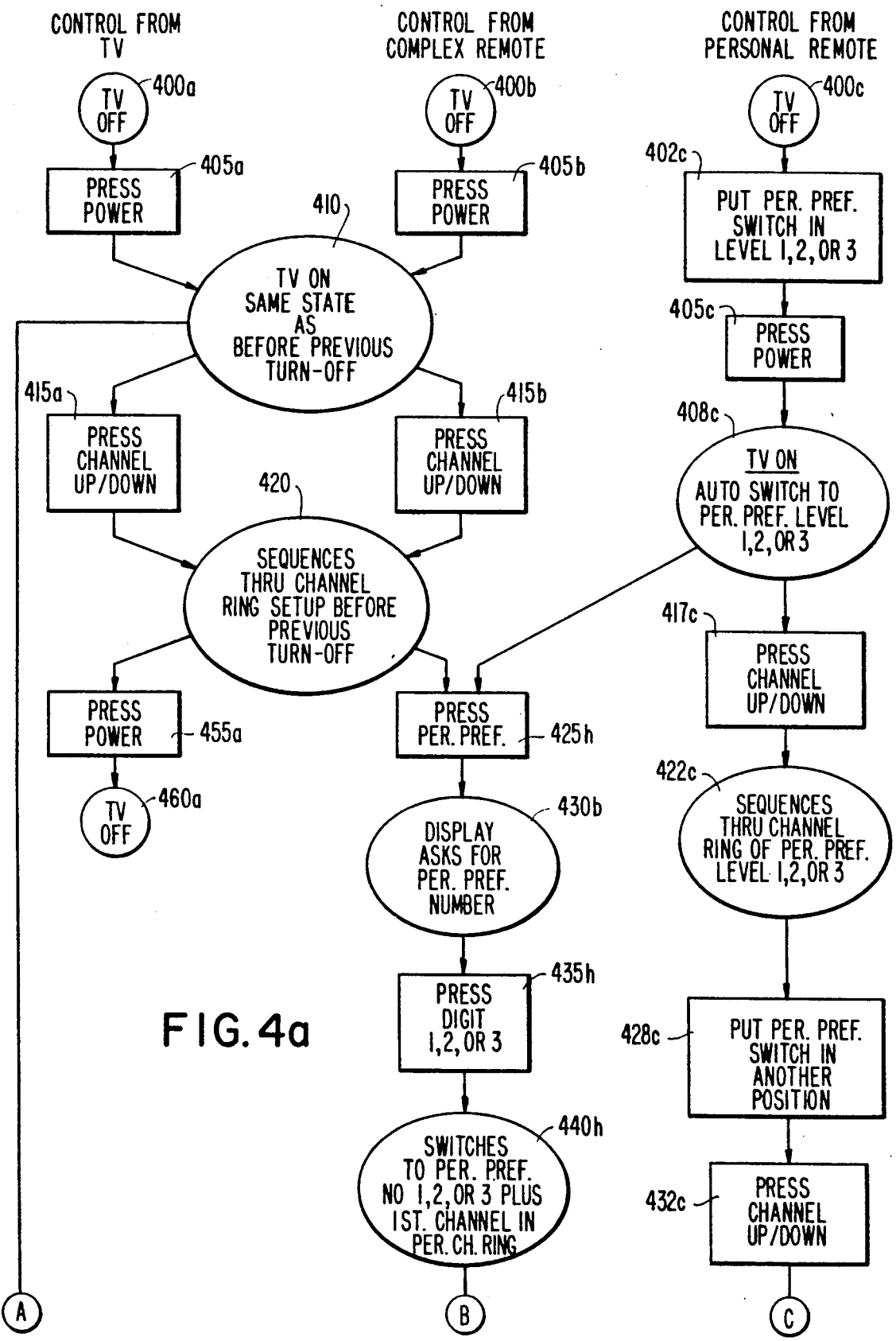
FIGS. 4a and 4b together provide a flow chart illustrating operation of the system invention where the television is controlled directly, from the complex remote, or from the personal remote.
Figure 4B:
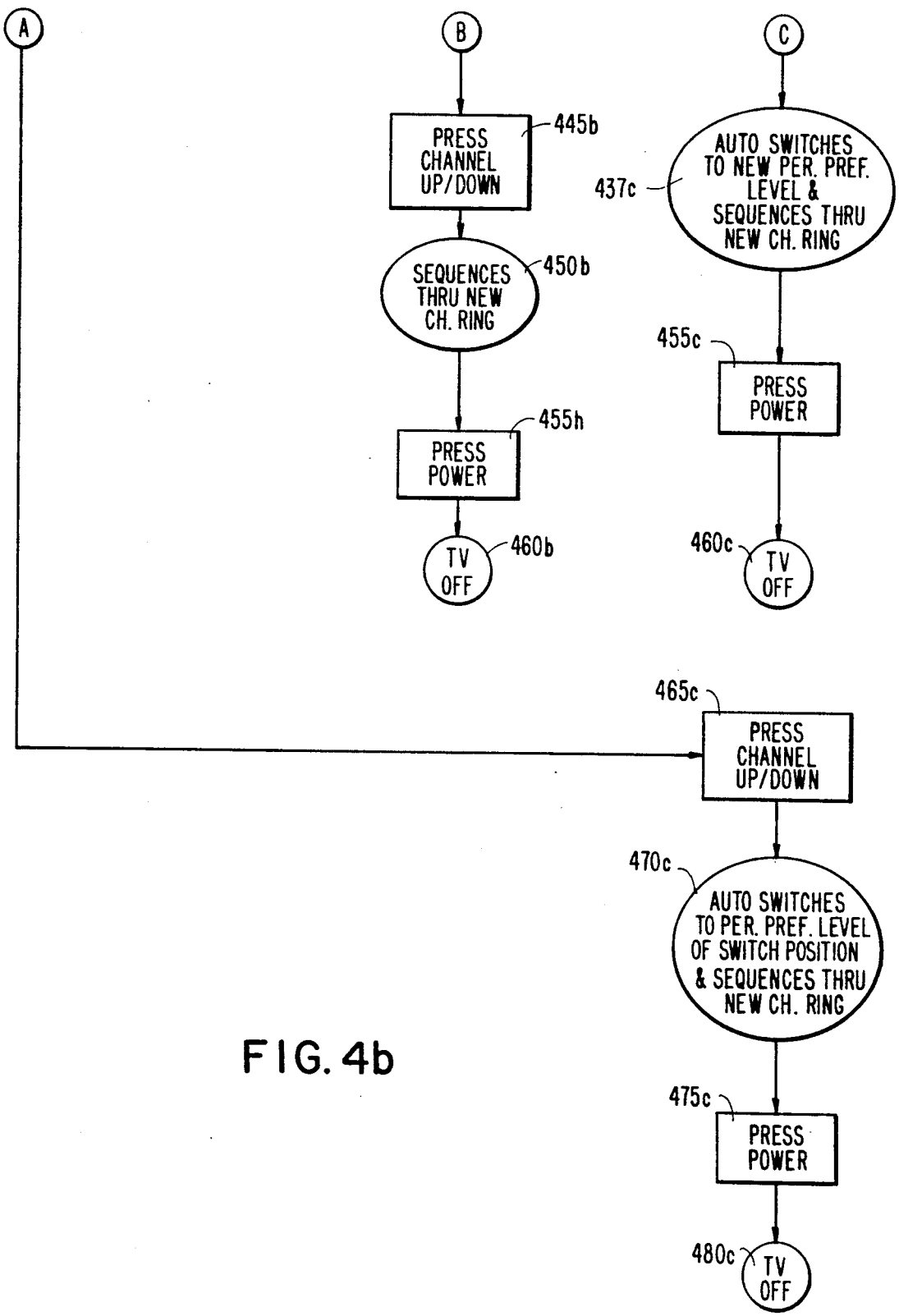

Before turning to FIGS. 4a and 4b, several points are worth noting. First, the microprocessor 230 of the auxiliary remote control transmitter device 200 is preferably capable of monitoring switch 280 to determine whether the location of switch 280 has been moved during a session. If switch 280 is moved, microprocessor 230 determines into which position the switch 280 is moved, but no action is taken until either the TV power key 210e is pressed (i.e. toggled off then on) or the channel up or channel-down keys are pressed. If the TV power key 210e is pressed to cycle the TV power to off then back to on, the microprocessor 30 of the television will access the personal preference parameter and channel rings associated with the new switch position as discussed above with reference to FIG. 2. Likewise, if the channel-up or channel-down keys are pressed, the personal preference parameter and channel rings of the new switch position would be accessed as discussed with reference to FIG. 2, as the channel-up and-down codes are also unique for each user of the auxiliary remote control transmitter 200 as well as for the user of the first remote control transmitter device 100 (see FIGS. 3e-3l). When the microprocessor 30 of the television 20 determines that the received channel-up or-down code is from a new user, if desired, the start-up channel for the new user, rather than the channel in the new user's personal preference channel ring which is next closest (either up or down) the channel which is being shown could be accessed.

Second, the personal preference rings of any of users one, two, or three, are preferably accessible form the first remote control transmitter device 100. Thus, first remote control transmitter device 100 preferably includes a "personal preference" key 110p (i.e. a soft key associated with a liquid crystal display on the complex remote). In response to the pressing of that key, microprocessor 130 causes a display to appear on the television 20 which requests that the user input a personal preference code (e.g. 1, 2, or 3). By pressing the digit key associated with the desired personal preference ring, the personal preference parameter routine is entered and the memory locations associated with the desired personal preference ring are accessed.

Turning to FIGS. 4a and 4b, a high-level flow chart representing operation of the system invention are seen. In FIGS. 4a and 4b, direct television operation is assumed (e.g. not via cable), and television operation may be had by touching controls on the television 20 from the first remote control transmitter device 100 or from the auxiliary remote control transmitter device 200. Referring first to control via the first remote control transmitter device 100 or by touching controls on the television 20, at 400a or 400b, the television 20 is off (i.e. the microprocessor 30 is in the sleep mode). By pressing at 405a or 405b the power-on button on the television or the first remote control transmitter device, the television 20 exits the sleep mode and at 410 returns to its previous state. At 415a or 415b, pressing the channel-up or channel-down keys on either the television 20 or first remote control transmitter device causes the television 20 at 420 to sequence through the channel ring which was previously accessed (before turn-off), until the desired channel is reached. If access to a new personal preference ring is desired, the personal preference key 110p of the first remote control transmitter device 100 is pressed at 425b. As a result, at 430b, a display appears on the television 20 requesting the personal preference number of the user. By pressing the appropriate digit at 435b, the personal preference parameter ring is entered at 440b such that the audio and video parameters are automatically adjusted, and the television 20 automatically tunes to the first channel in the personal preference channel ring. Now, pressing of the channel-up or channel-down keys at 445b causes the television to sequence through the new channel ring at 450b. Pressing the TV power key at 455a or 455b turns the television 20 off at 460a or 460b (i.e. in the sleep mode).

Control of the television 20 from the auxiliary remote control transmitting device 200 parallels control from the first remote control transmitter device in many ways. At 400c the television is off. Before the television is turned on, the personal preference switch 280 is located at 402c in a position. Pressing the TV power on button 210e at 405c causes the television 20 to exit the sleep mode at 408c, and to automatically switch into the personal preference rings associated with the switch location. Thus, pressing the channel-up and-down keys at 417c causes the television 20 to sequence at 422c through the desired channel ring. If the personal preference switch 280 is switched to a new location at 428c, upon the pressing of a channel-up or-down key at 432c, the television automatically switches at 437c to a new personal preference parameter ring as well as to the new personal preference channel ring. Again, pressing the TV power key 210c at 455c turns the television off at 460c.

As indicated in FIGS. 4a and 4b (by way of example only), crossovers between control from the television, from the first remote control transmitter device 100, and from the auxiliary remote control transmitter device 200 can occur. Thus, once the television is turned on and in its previous state at 410, control can proceed via either remote control transmitter device 100 or 200 or from the television 20 itself. If control from the auxiliary remote control transmitter device 200 is desired, the pressing of the channel-up or-down keys of the auxiliary remote control transmitter device 200 (i.e. crossover from television control to personal remote control) at 465c causes the television 20 to automatically switch at 470c into the personal preference rings associated with the switch location (as determined by microprocessor 30 of the television based on the received channel-up or-down code). Pressing the TV power key 210e of the personal remote at 475c turns the television off at 480c. Similarly, once step 410 is reached, control can proceed from the first remote control transmitter device 100 or from the television 20 as previously described.

Additional crossovers are indicated between the television and the first remote control transmitter device 100 at step 420, and between control from the auxiliary remote control transmitter device 200 and control from the first remote control transmitter device 100 at steps 408c to 425b. The crossover from step 408c to step 425b indicates that even after the auxiliary preference switch of the personal remote control transmitter device 200 is set at step 408c, a user of the first remote control transmitter device 200 can change the personal preference rings by pressing key 110p of the first remote control transmitter device 100.

There has been described and illustrated herein complex television systems capable of automatic personalized control. While particular embodiments have been illustrated and described, it is not an intention that the invention be limited thereto, as it is intended that the invention be as broad in scope as the art will allow. For example, while the personal preference switch on the auxiliary remote control unit transmitter device was described as having three positions, it will be appreciated that fewer or greater numbers of users may be accommodated by changing the details of the switch, and by adding (or eliminating) recognizable personal power on and channel-up and-down codes. Similarly, although such an embodiment is not preferred, a plurality of auxiliary remote control transmitter devices might be provided, each with its own recognizable personal power-on and-up and-down code. Also, while the auxiliary remote control transmitter device was described as having an absolute minimum of keys, it will be appreciated that additional keys such as a numeric set (0, and 1 through 9) could be added to permit the user of the auxiliary remote control transmitter device to override their personal preference channel ring should they desire to see a channel which was not included in their ring. Or if desired, a single control button (e.g. "escape channel ring") could be used to provide a signal which would cause the microprocessor 30 of the television to escape from the personal preference channel ring and be controlled by the channel up and channel down keys. An additional power on key for controlling a cable system might also be desirable in certain circumstances.

It will further be appreciated that while the remote control transmitter devices were described as including a ROM and a microprocessor, such hardware is not necessary. Instead, the closing of switches caused by the pushing of buttons of the remote control transmitter devices can be used in manners known in the art to transmit the desired information in the absence of a ROM and a microprocessor. In the desire to reduce costs, the elimination of the ROM and microprocessor of the auxiliary remote control transmitter device might be particularly advantageous, as little information is stored in the auxiliary remote ROM anyway. Also, it should be understood that instead of buttons or keys, the remote control transmitter devices could use pressure or heat sensitive crystals. However, for purposes herein, the terms "buttons" and "keys" shall be interpreted in their broadest sense to include any means by which user selection can be made through use of the fingers. Finally it should be appreciated that the term "ring", particularly as it is used with reference to personal preference parameters is intended to be understood broadly to include one or more sets of control items which are selectable by the user; the selection being typically (although not necessarily) made in a ring-like sequential fashion via a series of screen prompts and button presses. Therefore, it will be apparent to those skilled in the art that numerous other changes and modifications may be made to the invention as described without departing from the scope and spirit of the invention as so claimed.

I claim:
1. A television system comprising:
(a) a first remote control transmitter device having a plurality of first keyboard keys and a first infrared transmitter which are coupled such that the pressing of respective of said plurality of first keyboard keys causes said first infrared transmitter to transmit respective of a plurality of desired first signals;
(b) an auxiliary remote control transmitter device having a plurality of second keyboard keys, said plurality of second keyboard keys being substantially smaller in number than said plurality of first keyboard keys, and a second infrared transmitter, said plurality of second keyboard keys and said second transmitter being coupled such that the pressing of respective of said plurality of second keyboard keys causes said second infrared transmitter to transmit respective of a plurality of desired second signals, at least one of said desired second signals being uniquely distinguishable from all of said desired first signals; and (c) a television having an infrared receiver means for receiving said desired first and desired second signals; parameter control means for effecting control over an audio or video parameter of said television; a microprocessor coupled to the infrared receiver means for determining the meaning of said desired first and desired second signals, and coupled to the parameter control means for controlling the parameter control means in response to the received desired signals; and a programmable memory means for storing values for a plurality of personal preference parameter rings, including a value for at least said audio or video parameter, at least one of said plurality of personal preference parameter rings being associated with said uniquely distinguishable desired second signal of said auxiliary remote device, said programmable memory means being coupled to said microprocessor, wherein said programmable memory means is programmable when said television is in a programmable mode, and said programmable memory means is programmed with said values for said plurality of personal preference parameter rings by the pressing of a desired sequence of said first remote control transmitter device first keyboard keys.

2. A system according to claim 1, wherein:
said television includes a tuner control means for effecting control over to which channel number said television is tuned, said tuner control means being coupled to and controlled by said microprocessor; and
said programmable memory means also stores a plurality of channel preference rings channel number indications.

3. A system according to claim 1, wherein:
said auxiliary remote control transmitter device second keyboard keys include at least one power control key, at least one channel control key, and at least one volume control key.

4. A system according to claim 3, wherein:
said auxiliary remote control transmitter device second keyboard keys consist of at least one power control key, a channel (dash) up and a channel (dash) down control key, and a volume (-dash) up and a volume (-dash) down key.

5. A system according to claim 1, wherein:
said first remote control transmitter device has a nonvolatile memory and a second microprocessor, said second microprocessor being coupled to said nonvolatile memory, said plurality of first keyboard keys, and to said first infrared transmitter, wherein said second microprocessor controls said first infrared transmitter.

6. A system according to claim 5, wherein:
said second remote control transmitter device has a second nonvolatile memory and a third microprocessor, said third microprocessor being coupled to said second nonvolatile memory, said plurality of second keyboard keys, and to said second infrared transmitter, wherein said third microprocessor controls said second infrared transmitter.

7. A system according to claim 1, wherein:
said auxiliary remote control transmitter device further comprises a switch having at least two positions, wherein said auxiliary remote control transmitter device stores at least one uniquely distinguishable desired second signal for each position, and the position of said switch is associated with a particular user of said system, and said programmable memory means stores a personal preference parameter ring values for each said position.

8. A system according to claim 7, wherein:
said television includes a tuner control means for effecting control over to which channel number said television is tuned, said tuner control means being coupled to and controlled by said microprocessor; and
said programmable memory means also stores a plurality of channel preference rings channel number indications.

9. A system according to claim 8, wherein:
each personal preference parameter ring is associated with its own one of said plurality of channel preference rings.

10. A system according to claim 9, wherein:
said first remote control transmitter device has a nonvolatile memory and a second microprocessor, said second microprocessor being coupled to said nonvolatile memory, said plurality of first keyboard keys, and to said first infrared transmitter, wherein said second microprocessor controls said first infrared transmitter.

11. A system according to claim 10, wherein:
said second remote control transmitter device has a second nonvolatile memory and a third microprocessor, said third microprocessor being coupled to said second nonvolatile memory, said plurality of second keyboard keys, and to said second infrared transmitter, wherein said third microprocessor controls said second infrared transmitter.

12. A system according to claim 11, wherein:
said auxiliary remote control transmitter device second keyboard keys consist of at least one power control key, a channel -(dash) up and a channel -(dash) down control key, and a volume (dash) up and a volume (dash) down key.

13. A television system comprising:
(a) a first remote control transmitter device having a first plurality of first keyboard keys and a first infrared transmitter which are coupled such that the pressing of respective of said plurality of first keyboard keys causes said first infrared transmitter to transmit respective of a plurality of desired first signals;

(b) an auxiliary remote control transmitter device having a plurality of second keyboard keys, said plurality of second keyboard keys being substantially smaller in number than said plurality of first keyboard keys, and a second infrared transmitter, said second keyboard keys and said second infrared transmitter being coupled such that the pressing of respective of said plurality of second keyboard keys causes said second infrared transmitter to transmit respective desire second signals, at least one of said desired second signals being uniquely distinguishable rom all of said desired first signals; and (c) a television having an infrared receiver means for receiving said respective desired first and desired second signals; tuner control means for effecting control over to which channel said television is tuned; a microprocessor coupled to the infrared receiver means for determining the meaning of said desired first and desired second signals, and coupled to said tuner control means for controlling said tuner control means in response to the received desired signals; and a programmable memory means for storing channel number indications for a plurality of personal preference channel rings, at least one of said plurality of personal preference channel rings, at least one of said plurality of personal preference channel rings being associated with said uniquely distinguishable desired second signal of said auxiliary remote control transmitter device, said programmable memory means being coupled to said microprocessor, wherein said programmable memory means is programmable when said television is in a programmable mode, and said programmable memory means is programmed with said channel number indications for said plurality of personal preference channel rings by the pressing of a desired sequence of said first remote control transmitter device keys.

14. A system according to claim 13, wherein:
said first remote control transmitter device has a nonvolatile memory and a second microprocessor, said second microprocessor being coupled to said nonvolatile memory, said plurality of first keyboard keys, and to said first infrared transmitter, wherein said second microprocessor controls said first infrared transmitter.

15. A system according to claim 14, wherein:
said auxiliary remote control transmitter device has a second nonvolatile memory and a third microprocessor, said third microprocessor being coupled to said second nonvolatile memory, said plurality of second keyboard keys, and to said second infrared transmitter, wherein said third microprocessor controls said second infrared transmitter.

16. A system according to claim 13, wherein:
said auxiliary remote control transmitter device further comprises a switch having at least two positions, wherein said auxiliary remote control transmitter device stores at least one uniquely distinguishable desired second signal for each position, and the position of said switch is associated with a particular user of said system, and said programmable memory means stores channel number indications for a personal preference channel ring for each said position.

17. A system according to claim 14, wherein:
said auxiliary remote control transmitter device second keyboard keys include at least one power control key, at least one channel control key, and at least one volume control key.

18. A system according to claim 15, wherein:
said auxiliary remote control transmitter device second keyboard keys consist of at least one power control key, a channel -(dash) up and a channel -(dash) down control key, and a volume (dash) up and a volume (dash) down key.

19. A system according to claim 16, wherein:
said first remote control transmitter device has a nonvolatile memory and a second microprocessor, said second microprocessor being coupled to said nonvolatile memory, said plurality of first keyboard keys, and to said first infrared transmitter, wherein said second microprocessor controls said first infrared transmitter.

20. A system according to claim 19, wherein:
said auxiliary remote control transmitter device has a second nonvolatile memory and a third microprocessor, said third microprocessor being coupled to said second nonvolatile memory, said plurality of second keyboard keys, and to said second infrared transmitter, wherein said third microprocessor controls said second infrared transmitter.

* * * * *